(12) United States Patent
Tsivyan et al.

(10) Patent No.: US 12,148,464 B2
(45) Date of Patent: Nov. 19, 2024

(54) CURRENT LEAKAGE MANAGEMENT CONTROLLER FOR READING FROM MEMORY CELLS

(71) Applicant: Xilinx, Inc., San Jose, CA (US)

(72) Inventors: Michael Tsivyan, Campbell, CA (US); Shidong Zhou, Milpitas, CA (US); Karthy Rajasekharan, Austin, TX (US); Weiguang Lu, San Jose, CA (US); Jing Jing Chen, San Jose, CA (US); Mehul Vashi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 224 days.

(21) Appl. No.: 17/385,313

(22) Filed: Jul. 26, 2021

(65) Prior Publication Data

US 2023/0023614 A1   Jan. 26, 2023

(51) Int. Cl.
  *G11C 11/419*  (2006.01)
  *G11C 11/418*  (2006.01)
  *H10B 10/00*  (2023.01)

(52) U.S. Cl.
  CPC .......... *G11C 11/419* (2013.01); *G11C 11/418* (2013.01); *H10B 10/12* (2023.02)

(58) Field of Classification Search
  CPC ..... G11C 11/41; G11C 11/411; G11C 11/412; G11C 11/413; G11C 11/416; G11C 11/418; G11C 11/417; G11C 11/419
  See application file for complete search history.

(56) References Cited

U.S. PATENT DOCUMENTS

| | | | | |
|---|---|---|---|---|
| 6,343,039 | B2* | 1/2002 | Agawa | G11C 7/12 365/230.03 |
| 8,362,806 | B2 | 1/2013 | Wijeratne et al. | |
| 9,697,890 | B1* | 7/2017 | Wang | G11C 7/12 |
| 9,940,992 | B2* | 4/2018 | Atallah | G11C 11/419 |
| 10,803,928 | B2* | 10/2020 | Sinangil | G11C 11/418 |
| 10,998,018 | B1* | 5/2021 | Ranjan | G11C 7/18 |
| 2013/0010544 | A1* | 1/2013 | Lin | G11C 7/04 365/191 |
| 2017/0287550 | A1* | 10/2017 | Atallah | G11C 7/06 |
| 2018/0114583 | A1* | 4/2018 | Wang | G11C 7/067 |

* cited by examiner

*Primary Examiner* — Sung Il Cho
(74) *Attorney, Agent, or Firm* — Crawford Maunu PLLC

(57) ABSTRACT

First and second sensing circuits are coupled to first and second data lines, respectively, and sense levels of current leakage or a memory cell state on the first and second data lines. First and second keeper circuits are coupled to the first and second data lines, respectively, and drive the first and second data lines by a voltage supply through biased transistors. First and second leakage latches are coupled to receive and latch state of signals output from the first and second sensing circuits, respectively. A control circuit is coupled to the first leakage latch, second leakage latch, and outputs of the first and second sensing circuits. The control circuit is configured to select either the signal output from the first sensing circuit or the signal output from the second sensing circuit in response to states of the first and second leakage latches.

19 Claims, 5 Drawing Sheets

CURRENT LEAKAGE MANAGEMENT CONTROLLER FOR READING FROM MEMORY CELLS

TECHNICAL FIELD

The disclosure generally relates to remedying negative effects of current leakage in reading from memory cells.

BACKGROUND

Many electronic devices such as field programmable gate arrays (FPGAs), systems-on-chips (SoCs), systems-in-packages (SiPs) etc. have on-chip or in-package static random access memory (SRAM). These devices can have millions of memory cells distributed across a large area of a die.

In an array of memory cells the cells in a row of the array typically share complementary data lines, which can be denoted as "d" and "d_b." As feature dimensions have decreased, at present from 10 nm technology to 7 nm technology, testing has revealed that errors can sometimes occur in reading from the memory cells. For example, a bit value 0 is read when the correct bit value is 1, and vice versa. The source of errors in reading from the memory cells has been traced to current leakage from the memory cells on the data lines. As feature dimensions have decreased, current leakage from memory cells has become increasingly problematic and has led to significant losses in die yield.

SUMMARY

A disclosed circuit arrangement includes a first sensing circuit coupled to a first data line and configured to sense a level of current leakage or a memory cell state on the first data line. A first keeper circuit is coupled to the first data line and is configured to drive the first data line by a voltage supply through a biased transistor. A first leakage latch is coupled to receive and latch a state of a signal output from the first sensing circuit. The circuit arrangement additionally includes a second sensing circuit coupled to a second data line and configured to sense a level of current leakage or a memory cell state on the second data line. A second keeper circuit is coupled to the second data line and is configured to drive the second data line by a voltage supply through a biased transistor. A second leakage latch is coupled to receive and latch a state of a signal output from the second sensing circuit. The circuit arrangement additionally includes a control circuit coupled to outputs of the first leakage latch and the second leakage latch and coupled to receive the outputs of the first sensing circuit and the second sensing circuit. The control circuit is configured to select either the signal output from the first sensing circuit or the signal output from the second sensing circuit in response to states of the first leakage latch and the second leakage latch.

A disclosed method includes sensing levels of current leakage on a first data line and a second data line by first and second sensing circuits, respectively. The method includes adjusting strengths of first and second keeper circuits coupled to the first data line and second data line in response to sensed levels of current leakage. The method additionally includes selecting a signal on the first data line or the second data line for output in response to the sensed levels of current leakage.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

Figure 1:
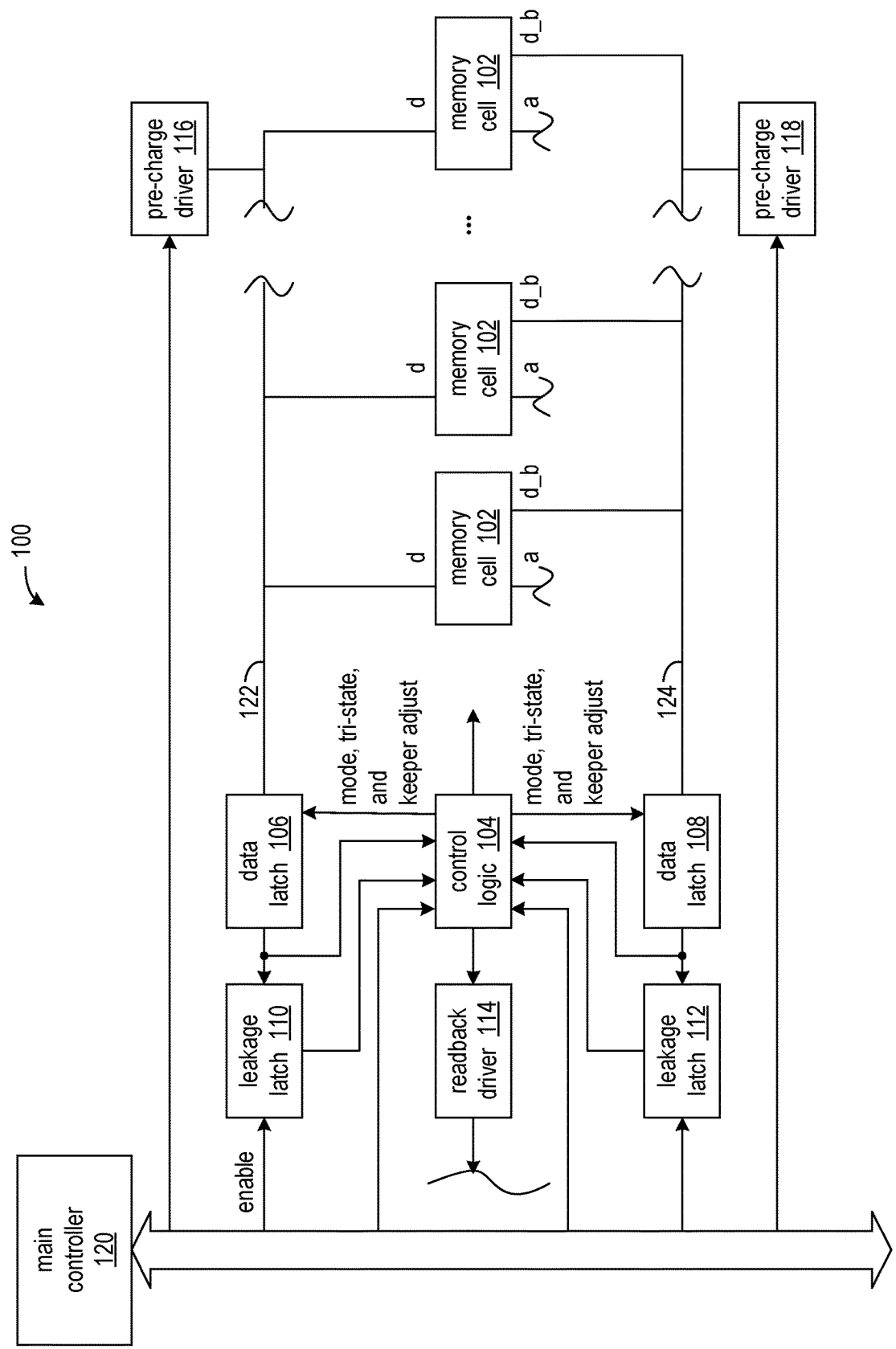
FIG. 1 shows a circuit arrangement for adapting to current leakage on the data lines for reading from memory cells.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

A typical static random access memory ("SRAM") consists of an array of memory cells in which each cell is accessed through one address line and two complementary data lines. A typical SRAM cell consists of six transistors: two back to back inverters and two NMOS transistors ("pass gates") controlled by the address line. The pass gates are connected to the cell's internal nets ("q" and "q_b") on one side, and to the external data lines ("d" and "d_b") on the other. Each pair of data lines is connected to a row of cells whose pass gates are controlled by different address lines. Each address line is connected to a column of cells each of which is connected to different data lines.

In many SRAM designs, data propagates from or toward a main controller across long data lines that are broken into segments. At the boundaries of each segment there are bi-directional buffers through which data propagates (i) from the main controller towards the selected row during write operations; or (ii) from the selected row toward the main controller during read operations.

To write data into a selected row of cells, each pair of data lines within the row is first set to the desired complementary values, either (d=0 and d_b=1) or (d=1 and d_b=0), and only then the address line is asserted. At that time, the buffers at the segment boundaries operate in "write" mode.

To read data from a row of cells, all data lines are first pre-charged, i.e. set to (d=1 and d_b=1), and only then the address line is asserted. Once the address line is asserted, each cell will attempt to discharge, through one of its pass gates, either d or d_b connected thereto. Detecting which data line, d or d_b, is being discharged reveals whether that cell has q=0 or q=1. The detection occurs at the segment boundaries where the buffers operate in "read" mode.

One approach for detecting the cell's state involves a latch-type sense amplifier at the segment boundary that (i)

drives the data line with a weak PMOS transistor ("keeper"); (ii) senses the data line by having an inverter's input connect to the data line; and (iii) once the voltage on the data line drops below the inverter's trip point, the output of the inverter triggers the latch that disables the keeper and enables a strong NMOS transistor that discharges the data line to 0. The latch has two advantages. First, the latch significantly reduces load on the power supply. Once the data line is fully discharged to 0, there will be no static current flowing from the power supply except for that necessary to compensate leakage. Second, the latch registers the cell's state. Once a latch is triggered, the address line can be de-asserted without waiting until the data propagation across data line segments reaches the main controller.

Under the approach described above, keepers serve two conflicting purposes. The first purpose is to prevent the data line, which the cell does not attempt to discharge, from being discharged by leakage current on the data lines. If the leakage current can discharge d or d_b, the latch would be unable to detect the cell's state. Thus, the keeper must be able to provide more current than that generated by the leakage. The second purpose is to allow the data line, which the cell does attempt to discharge, to be discharged below a certain detectable level. Thus, the keeper must be weak enough to provide only a fraction of the current generated by the cell.

SRAM designs often involve balancing the strength of keepers in order to resolve the conflicting purposes. To illustrate, consider a cell having q=0 and q_b=1. After d and d_b are both pre-charged and the address line is thereafter asserted, the keepers should meet two requirements:

(i) the keeper driving d should be weak enough to allow the cell's q net to discharge d (through the pass gate) below the trip point of the inverter to trigger the latch connected to d;

(ii) the keeper driving d_b should be strong enough to keep d_b pre-charged despite the leakage generated by other cells connected the same d_b line.

To meet the first requirement, keepers are usually designed to be a fraction of the strength of an average cell. To meet the second requirement, designers limit the number of cells sharing the data lines based on an estimate of the worst-case leakage.

When the keepers are not properly balanced, not only can errors occur during read operations, but the state of a memory cell can also be disturbed. A cell is "disturbed" when it changes its state during the read operation. A disturbance could occur when keepers do not adequately compensate for the leakage. For example, suppose that a cell has q=0 and q_b=1. If d_b is discharged below the trip point by the leakage when the address line is asserted, the latch driving d_b would disable the keeper entirely and instead activate the strong NMOS transistor that would attempt to lower d_b to 0 while the cell would attempt to raise d_b to 1. In such a case, the NMOS transistor in effect operates as a write driver that writes d_b=0 into the cell, which could cause q_b to transition from 1 to 0. One approach to avoid this problem is to prevent the data latches from disabling the keeper and from activating the NMOS transistors. In this mode keepers are "always on." The major disadvantage of this "always on" mode is that it necessarily generates large static current flowing across data lines. Even though the keepers limit that current, the current level would still be substantial due to the large number of data lines. Another disadvantage of the "always on" mode is that the data is not registered, which means the address line must remain asserted until the data propagates across all segments and reaches the main controller. In contrast, when the "always on" mode is not activated (hereinafter "register mode"), de-assertion of the address line and propagation of the data can occur concurrently and thereby increase the overall performance of read operations.

The dominant leakage component comes from drain-to-source leakage of the pass gates. Cells with q=0 generate leakage on d, while cells having q_b=0 generate leakage on d_b. A greater difference between drain and source voltage across a pass gate results in greater leakage, which increases exponentially with temperature. Oftentimes, most of the cells in a row have q=0 and generate large leakage on d. It has been observed at high temperatures that the leakage is large enough to overcome the keeper and discharge d below the sensor's trip point, which prevents the sensor from detecting the actual state of the cell.

Decreases in feature size have made balancing the strength of the keeper more difficult. As features sizes have decreased, the number of memory cells on a data line has increased. In addition, the leakage from each memory cell has increased with smaller feature sizes. Thus, read errors are becoming increasingly problematic.

In the approaches described above the keepers are designed for the worst-case scenario. The keepers must withstand leakage at the highest temperature at the worst data pattern even though the leakage could vary significantly due to temperature and the data pattern. The disclosed approaches first determine the leakage levels on a particular pair of data lines and based on that information (i) give preference to the data line that will be sensed and registered while the other data line will operate in the "always on" mode to avoid the problem of disturbing the cell; and (ii) adjust the keeper strength on both data lines. The disclosed circuits and methods take advantage of the fact that only one data line among d and d_b needs to be sensed and registered, and thus there is a choice to select the one that is not affected by leakage, or that is less affected by leakage. For example, if the leakage on d is so strong that it discharges d below the trip point while the leakage on d_b does not, it would be more beneficial to sense and register d_b rather than d. To avoid pattern dependency, a dedicated controller and two one-bit memory elements can determine which one of d or d_b should be selected for reading. The controller can also detect cases in which the leakage on both d and d_b discharges both data lines below the trip point, and in response increase the strength of both keepers to compensate for that high leakage.

According to the disclosed circuits and methods, the complementary data lines are coupled to two sensors. The first sensing circuit senses the first data line (d), and the second sensing circuit senses the second data line (d_b). First and second leakage latches are coupled to receive and register states of the output from the first and second sensing circuits, respectively. First and second keeper circuits are respectively coupled to the complementary data lines and drive the data lines by a supply voltage through biased transistors. A control circuit is coupled to outputs of the first and second leakage latches, and also coupled to the outputs of the first sensing circuit and the second sensing circuit. The control circuit selects either the output from the first sensing circuit or the output from the second sensing circuit in response to states of the first leakage latch and the second leakage latch.

FIG. 1 shows a circuit arrangement 100 for reading memory cells while adapting to data line leakage. The circuit arrangement can operate in (i) a leakage sensing mode to obtain and store information indicative of leakage levels on the data lines, or (ii) a cell sensing mode to determine data (e.g., a logic value) of the row selected by the address line.

As the leakage sensing introduces additional steps that need to occur before the reading of a memory cell, the leakage sensing may slow read operations if sensing were to be performed for every read operation. It has been recognized that the leakage sensing may be unnecessary for every read operation, because the leakage level may remain relatively steady over successive read operations. Instead, the leakage sensing can be selectively activated, such as in response to initial powering-up of the device, after some number of write operations or read operations, or in response to a significant change in temperature of the integrated circuit die.

The memory cells 102 have outputs connected to data lines 122 and 124. Address inputs to the memory cells are connected to the gates of the pass gate transistors of the cells and shown as "a" lines. The data latches 106 and 108 are latch-type sense amplifiers. The data latches include (i) sensors (e.g., FIG. 2, reference number 220 and FIG. 3, reference number 320) that detect whether voltage on the data line is above or below the sensor's trip point; (ii) latches (e.g., FIG. 2, reference numbers 212, 224, 222; and FIG. 3, reference numbers 312, 324 and 322) that hold the data line pre-charged before the address line is asserted; and (iii) keepers e.g., (FIG. 2, reference number 202 and FIG. 3, reference number 302) that weaken the pull-up strength of the data latches. Once the address line is asserted, the cell starts discharging either d or d_b. Once voltage on a data line drops below the trip point of the sensor (220 or 320), the voltage drop causes output from either of the sensors (e.g., FIG. 2, reference number 228 or FIG. 3, reference number 328) to transition from logical 0 to logical 1, which activates the pull-down path (FIG. 2, reference numbers 212, 222 or FIG. 3, reference number 312, 322), the latch changes its state and from that point the pull-down path of the latch discharges the data line. When the latch changes its state, it thereby registers the cell's state and at that point the address line can be de-asserted. After the address line is de-asserted, the data latches drive d and d_b and at the same time pass the information about the cell's state through control logic 104 and readback driver 114 until the state reaches the main controller 120.

Figure 2:
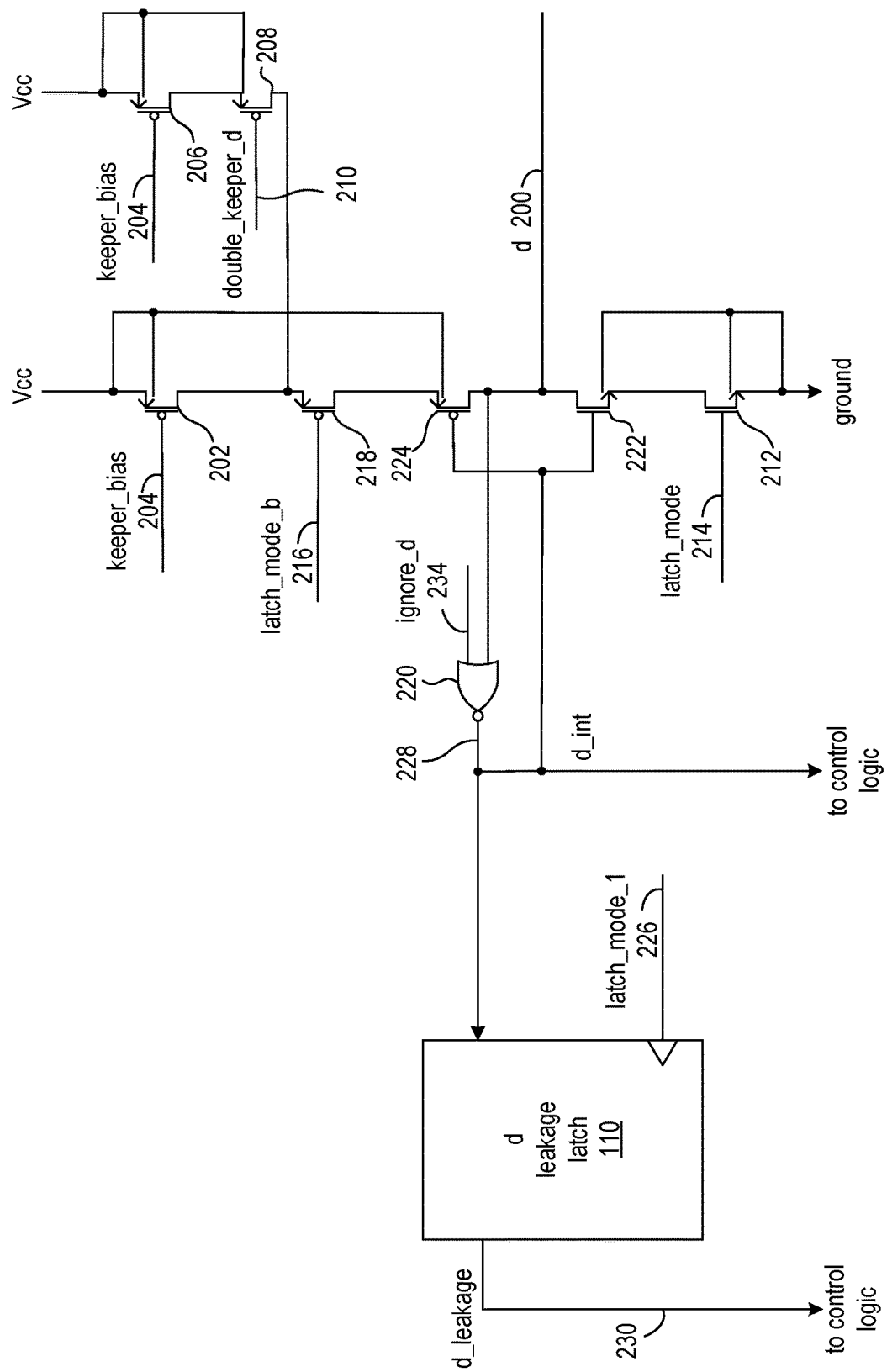
FIG. 2 shows a schematic of the data latch and leakage latch for the data line d.

The data latch 106 operates in either "always on" mode or "register" mode in response to a signal from the control logic 104 (see FIG. 2: "always on" mode when signal 234 is asserted and "register" mode when signal 234 is de-asserted). Similarly, the data latch 108 operates in either "always on" or "register" mode in response to a signal from the control logic 104 (see FIG. 3: "always on" mode in response to assertion of signal 334 and "register" mode in response to de-assertion of signal 334). In the "always on" mode, the data line is driven by the keeper that is never disabled, i.e. remains "always on."

The disclosed circuitry uses a mechanism in which one of two data latches is selected to determine the state of a memory cell. One of the data latches is selected based on the leakage level of data lines. The selected data latch operates in the "register mode," while the other latch operates in the "always on" mode. The circuitry protects against disturbing the state of the memory cell and at the same time allows high performance reading from memory cells.

The control logic 104 and main controller 120 control sensing of the data lines for detecting the cell's state and for detecting the leakage level on the data lines. The information about the leakage levels is stored in the leakage latches 110 and 112. Based on that information, the control logic 104 selects the output signal from either data latch 106 or data latch 108, and passes it to the readback driver 114. The main controller activates and deactivates the pre-charge drivers 116 and 118 at appropriate times, which is prior to leakage sensing and prior to cell sensing. Note that a write driver is not shown, as current leakage is not problematic during write operations, and the write driver would be tri-stated during read operations.

The protocol implemented by the circuit arrangement 100 in the leakage sensing mode begins with the main controller 120 activating the pre-charge drivers 116 and 118 and opening the leakage latches 110 and 112. The main controller signals the control logic 104 to tristate the data latches 106 and 108 during the pre-charging. After the data lines are pre-charged, the main controller tri-states the pre-charge drivers, and at the same time opens the data latches which allows the keepers to drive the data lines. After waiting for a period of time that is equal to or greater than the period of time for cell sensing, the leakage latches are closed, which registers data that indicate the levels of leakage on the data lines. The leakage level on a data line is deemed "low" when it is insufficient to discharge the data line below the sensor's trip point during the time period allocated for leakage sensing. It is desirable to allocate more time for leakage sensing than for cell sensing as this difference provides margins that assure more secure read operations. The ability to control the leakage margins by increasing this time difference is particularly important during the debugging and silicon characterization stages of a product development.

The protocol implemented by the circuit arrangement 100 in the data sensing mode begins with the main controller signaling the control logic 104 to tri-state the data latches, 106 and 108, and to activate the pre-charge drivers 116 and 118. The main controller keeps the leakage latches 110 and 112 closed during the read operation. Following pre-charging, the control logic 104 tri-states the pre-charging drivers 116 and 118, and at the same time opens the data latches 106 and 108 thereby engaging the keepers. In response to states of signals output from the leakage latches, the control logic (i) controls the keeper strength of the data latches; (ii) signals the data latch whether it operates in the "register" or "always on" mode; and (iii) passes the cell's state to the readback driver.

Table 1 shows a truth table of values of the leakage latches 110 and 112, along with associated signals provided by the control logic 104 to the readback driver 114 and adjustments to the keeper strengths and the mode ("always on" or "register") of the data latches 106 and 108.

TABLE 1

| leakage latch d_leakage | leakage latch d_b_leakage | input to readback driver | keeper strength and mode at data latch d | keeper strength and mode at data latch d_b |
| --- | --- | --- | --- | --- |
| 1 | 1 | d_b_int | single, always on | single, register |
| 0 | 1 | d_b_int | double, always on | single, register |
| 1 | 0 | ~d_int | single, register | double, always on |
| 0 | 0 | d_b_int | double, always on | double, register |

The column labeled "leakage latch d_leakage" indicates possible states of the leakage latch 110, and the column labeled "leakage latch d_b_leakage" indicates possible states of leakage latch 112. The third column indicates signals ("d_int" and "d_b_int") from the data latches selected by the control logic 104 and provided to the readback driver 114 based on the states of the leakage latches. The fourth and fifth columns indicate (i) the levels of keeper strength of the data latches 106 and 108; and (ii) which data latch senses the cell, i.e. operates in the "register" mode, and which data latch does not sense the cell, i.e. operates in the "always on" mode.

The output signal provided by the control logic 104 to the readback driver 114 is the state of the signal from the data latch 108 (d_b_int) in response to low leakage indicated on both data lines (both leakage latches 110 and 112 having bit value 1), high leakage indicated on both data lines (both leakage latches 110 and 112 having bit value 0), or high leakage indicated on data line d and low leakage indicated on data line d_b (the leakage latch 110 having bit value 0 and leakage latch 112 having bit value 1). In response to a low leakage level indicated on data line d and a high leakage level indicated on data line d_b (leakage latch 110 having bit value 1 and leakage latch 112 having bit value 0), the output signal provided by the control logic to the readback driver is the inverted state of the signal from the data latch 106 (~d_int).

The control logic 104 can (i) adjust strength of each keeper of the data latches 106 and 108 to a suitable level, and (ii) set each data latch in either "register" or "always on" mode based on the sensed leakage levels of the data lines as indicated by the states of the leakage latches 110 and 112. Though the exemplary circuit arrangement discloses levels of keeper strength that are "single" and "double," as further shown in FIGS. 2 and 3, it will be appreciated that additional levels of keeper strength in different increments can be implemented based on application requirements.

As shown in Table 1, in response to low leakage indicated on both data lines (both leakage latches 110 and 112 having bit value 1, both data latches 106 (d) and 108 (d_b) are set to single keeper strength, and the data latch d is set to "always on" mode. In response to high leakage indicated on data line d and low leakage indicated on data line d_b (the leakage latch 110 having bit value 0 and leakage latch 112 having bit value 1), the keeper strength of data latch d is set to double keeper strength, the data latch d is set to "always on" mode, and the keeper strength of data latch d_b is set to single keeper strength. In responses to low leakage level indicated on data line d and high leakage level indicated on data line d_b (leakage latch 110 having bit value 1 and leakage latch 112 having bit value 0), data latch d is set to single keeper strength, data latch d_b is set to double keeper strength, and data latch d_b is set to "always on" mode. In response to high leakage indicated on both data lines (both leakage latches 110 and 112 having bit value 0), the keeper strength of data latch d is set to double keeper strength, the data latch d is set to "always on" mode, and the keeper strength of data latch d_b is set to double keeper strength.

The disclosed circuits support sensing of data line leakage and adjustment of keeper strength on the data lines for individual sets of memory cells (e.g., a row in an array). That is, different sets of memory cells can be configured with different keeper strengths based on the different levels of leakage sensed on the data lines of the sets of memory cells. Though only a single set of memory cells associated control logic, data latches, leakage latches and pre-charge drivers are shown in FIG. 1, multiple instances of the set memory cells and associated control logic, data latches, leakage latches, and pre-charge drivers can be implemented as an array of memory cells. Furthermore, readback driver 114 can be used as a pre-charge driver, in which case either 116 or 118 can be eliminated.

FIG. 2 shows a schematic of the data latch 104 and leakage latch 110 for the d data line 200 (also FIG. 1, 122). The keeper of the data latch is PMOS transistor 202 having its gate connected to a keeper reference voltage, keeper_bias 204. The keeper_bias can be calibrated to limit the current through transistors 202 and 206 to a fraction of the average memory cell current during a read operation.

The keeper strength can be adjusted by switching-in or switching-out additional pull-up transistors in response to the levels of data line leakage indicated by the leakage latches. The keeper strength can be increased by connecting pull-up PMOS transistor 206 in parallel with the pull-up transistor 202 through PMOS transistor 208. The double_keeper_d signal 210 is connected to the gate of transistor 208 for adjusting the keeper strength.

The data latch has a strong pull-down provided by NMOS transistor 212. The latch_mode signal 214 is connected to the gate of transistor 212. The latch_mode_b signal 216 is connected to the gate of PMOS transistor 218. The latch_mode and latch_mode_b signals can be used to tri-state the data latch during pre-charging and during write operations. The latch_mode and latch_mode_b signals can be generated from latch_mode_1 226 and latch_mode_2 (FIG. 4) signals provided from the main controller 120 (FIG. 1). If either latch_mode_1 or latch_mode_2 is logic high, then the latch_mode signal is logic high and latch_mode_b is logic low.

Signal ignore_d determines whether the data latch operates in the "register" or "always on" mode. When ignore_d is logic high, the output of NOR gate 220 is logic low, which disconnects the data latch from the pull-down and connects the data latch to the keeper, putting the data latch in the "always on" mode. The "always on" mode prevents the data latch from operating in the latch mode.

In the "register" mode, once data line 200 is pre-charged, the output d_int of NOR gate 220 is logic low, which disables the pull-down through NMOS transistor 222 and connects to the pull-up through PMOS transistor 224. The closed transistor 224 engages the data latch, which is driven by the keeper. Before disabling the pre-charge diver of d data line 200, latch_mode_b 216 closes the PMOS transistor 218 to connect the keeper to the data line, enabling the keeper and the latch to drive the d data line logic high. The pre-charge driver can be disabled after connecting the keeper to the data line.

The leakage latch 110 can be implemented by a standard cell, which is enabled by the latch_mode_1 signal 226. The data input to the leakage latch is the d_int signal 228 output from the NOR gate 220, which is also provided as input to the control logic 104. The data output d_leakage 230 from the leakage latch is also provided as input to the control logic 104.

The latch_mode_1 signal 226 is driven by the main controller 120 and asserted when current leakage is to be sensed, which enables storage of the sensed logic value in leakage latch 110. The latch_mode_1 signal is asserted, for example, when a counted number of read and/or write operations reaches a pre-determined number and/or in response to a temperature sensor on the integrated circuit die rising above or falling below a threshold temperature(s). During the leakage sensing, latch_mode_2=0 which causes the keepers to operate at their ordinary strength. During the cell sensing, latch_mode_2 is logic high which causes the keepers to operate at the strength based on the truth table in Table 1.

Figure 3:
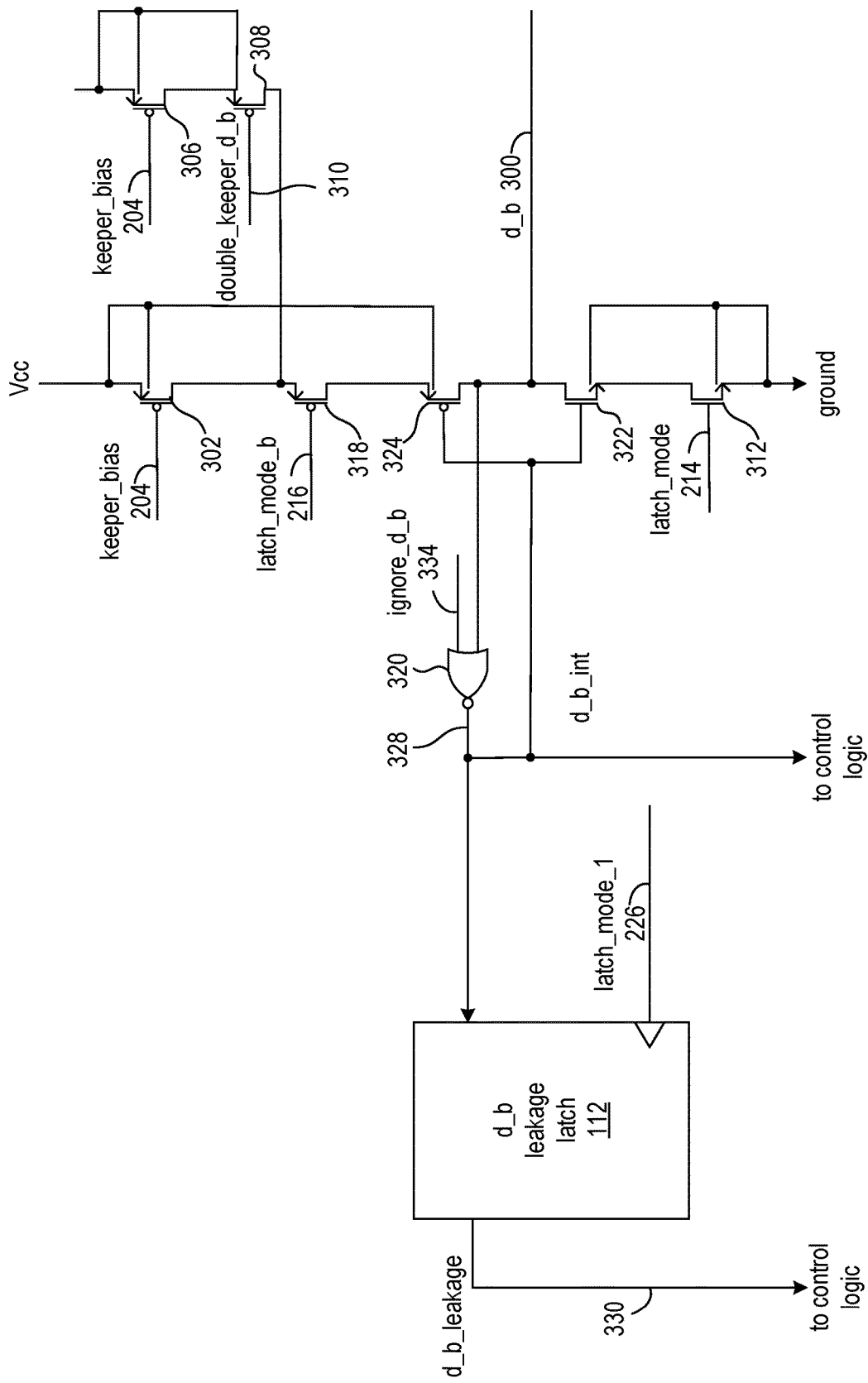
FIG. 3 shows a schematic of the data latch and leakage latch for the d_b data line.

FIG. 3 shows a schematic of the data latch 108 and leakage latch 112 for the d_b data line 300 (also FIG. 1, 124). The keeper of the data latch is PMOS transistor 302 having its gate connected to a keeper reference voltage, keeper_bias 204, which can be calibrated to limit the current through transistors 202 and 206 to a fraction of the average memory cell current during a read operation . . .

The keeper strength can be adjusted by switching-in or switching-out additional pull-up transistors in response to the level of current leakage indicated by the leakage latches. The keeper strength can be increased by connecting pull-up PMOS transistor 306 in parallel with the pull-up transistor 302 through PMOS transistor 308. The double_keeper_d_b signal 310 is connected to the gate of transistor 308 for adjusting the keeper strength.

The data latch has a strong pull-down provided by NMOS transistor 312. The latch_mode signal 214 is connected to the gate of transistor 312. The latch_mode_b signal 216, which is the logical complement of the latch_mode signal, is connected to the gate of PMOS transistor 318. The latch_mode and latch_mode_b signals can be used to tri-state the data latch during pre-charging and during write operations. The latch_mode and latch_mode_b signals can be generated from latch_mode_1 226 and latch_mode_2 (FIG. 4) signals provided from the main controller 120 (FIG. 1). If either latch_mode_1 or latch_mode_2 is logic high, then the latch_mode signal is logic high and latch_mode_b is logic low.

Signal ignore_d_b determines whether the data latch operates in the "register" or "always on" model. When ignore_d_b is logic high, the output of NOR gate 320 is logic low, which disconnects the data latch from the pull-down and connects the data latch to the keeper, putting the data latch in the "always on" mode. The "always on" mode prevents the data latch from operating in the latch mode.

In the "register" mode, once data line 300 is pre-charged, the output d_b_int of NOR gate 320 is logic low, which disables the pull-down through NMOS transistor 322 and connects to the pull-up through PMOS transistor 324. The closed transistor 324 engages the data latch, which is driven by the keeper. Before disabling the pre-charge diver of d_b data line 300, latch_mode_b signal 216 closes the PMOS transistor 318 to connect the keeper to the data line, enabling the keeper and the latch to drive the d_b data line logic high. The pre-charge driver can be disabled after connecting the keeper to the data line.

The leakage latch 112 can be implemented by a standard cell, which is enabled by the latch_mode_1 signal 226. The data input to the leakage latch is the d_b_int signal 328 output from the NOR gate 320, which is also provided as input to the control logic 104. The data output d_b_leakage 330 from the leakage latch is also provided as input to the control logic 104.

While current leakage is being sensed, the main controller maintains the latch_mode_2 signal at logic low, which drives the double_keeper_d_b signal 310 to logic high (FIG. 4) and disables double keeper strength (opens PMOS transistor 308). In response to latch_mode_2 being logic high, the keeper strength can be adjusted, and the data latch can sense the logic state on the d_b data line.

Figure 4:
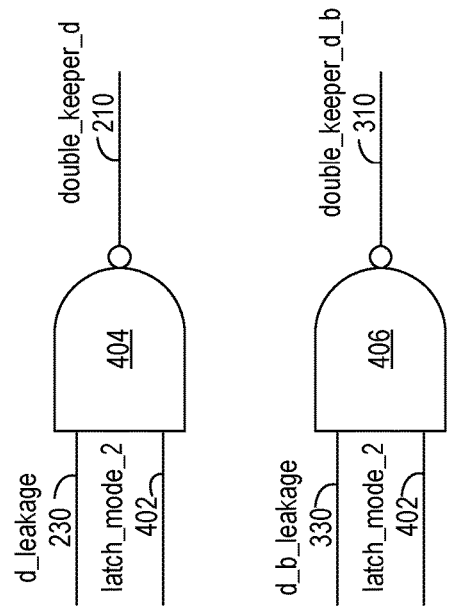
FIG. 4 shows a portion of the control logic that generates the signals for controlling the keeper strength of the data latches.

FIG. 4 shows a portion of the control logic that generates the signals for controlling the keeper strength of the data latches 106 and 108 (FIG. 1). The latch_mode_2 402 signal is generated by the main controller as described above, the d_leakage signal 230 is the output signal from the leakage latch 110 (FIG. 2), and the d_b_leakage signal 330 is the output signal from the leakage latch 112 (FIG. 2). The d_leakage signal and latch_mode_2 signals are input to NAND gate 404, and the d_b_leakage signal and latch_mode_2 signals are input to NAND gate 406. NAND gate 404 generates the double_keeper_d signal 210, and NAND gate 406. NAND gate 406 generates the double_keeper_d_b signal 310.

Figure 5:
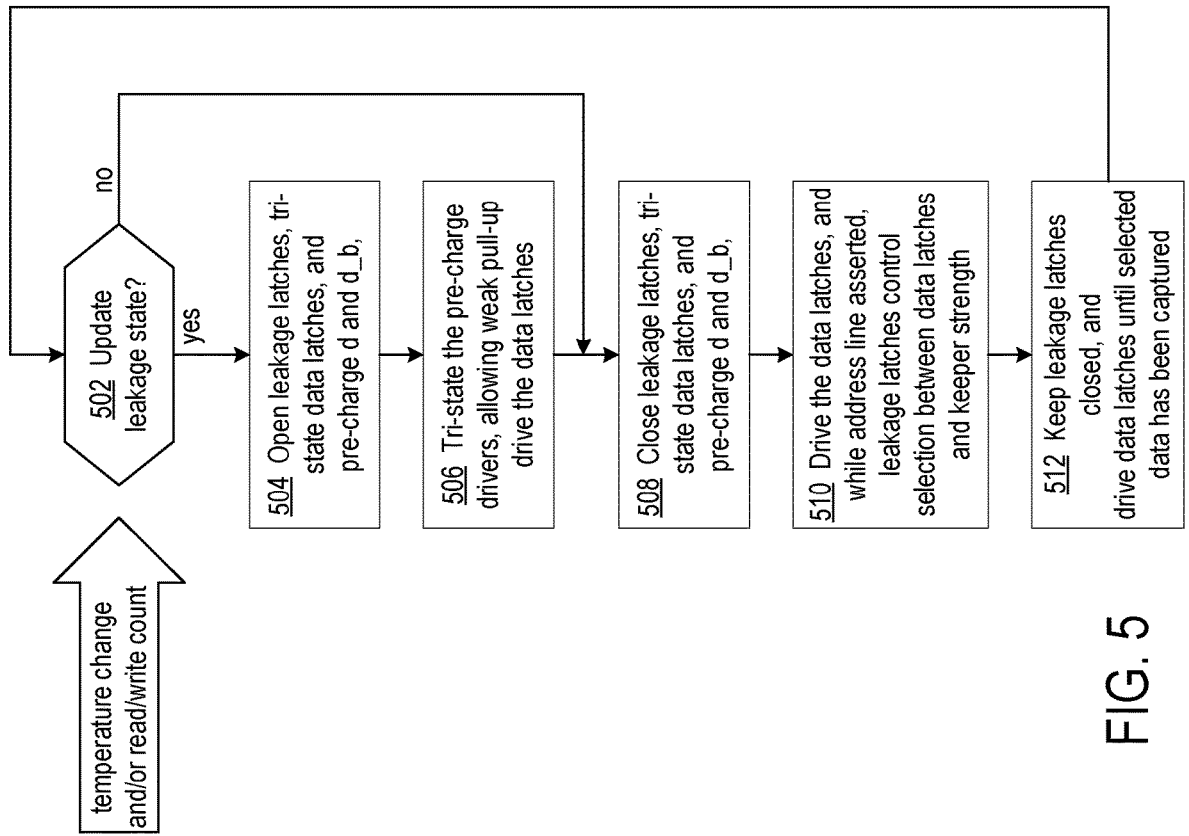
FIG. 5 shows a flow chart of an exemplary process for adapting reads from memory cells in response to changing levels of current leakage on the data lines.

FIG. 5 shows a flow chart of an exemplary process for adapting reads from memory cells in response to changing levels of current leakage on the data lines. At decision block 502, the process determines whether or not to update the data that indicate levels of current leakage on the data lines. The signal to update the leakage information can based on a change in temperature of the IC die or after every occurrence of a threshold number of read and/or write operations. If sensing of current leakage has not been triggered, the sensing at blocks 504 and 506 is bypassed, and the process can continue at block 508 to perform a read operation.

Otherwise, at block 504 the process of sensing current leakage begins by opening the leakage latches (e.g., asserting the latch_mode_1 signal to logic high), tri-stating the data latches (e.g., FIGS. 2, 3 latch_mode and latch_mode_b signals), and pre-charging the d and d_b data lines.

The transition from block 504 to block 506 shifts the control over the data lines from the strong pre-charge drivers to the weak keepers, which compete with the leakage. If the data line leakage overcomes the keeper, the data latch is triggered. At block 506, the pre-charge drivers are tri-stated, allowing the weak pull-ups of the keepers to drive.

At completion of sensing the current leakage or when commencing a read operation without pre-sensing, at block 508 the leakage latches are closed (e.g., de-asserting or maintaining the latch_mode_1 signal to/at logic low). The pre-charge drivers of the d and d_b data lines can then be enabled. The transition from block 508 to block 510 shifts control over the data lines from the strong pre-charge driver to the weak keeper that competes with the memory cell. The data latch is triggered in response to memory cell overcoming the keeper.

At block 510, while the address line is asserted, the control circuit uses the states of the leakage latches to select and generate an output signal to the readback driver, determine whether or not and to what level to adjust the strength of the keepers, and determine which of the data latches should be placed in always-on mode.

At block 512, the leakage latches remain closed. The data latches are driven for a sufficient period of time to allow the sensed bit value to be registered at a desired destination.

Figure 6:
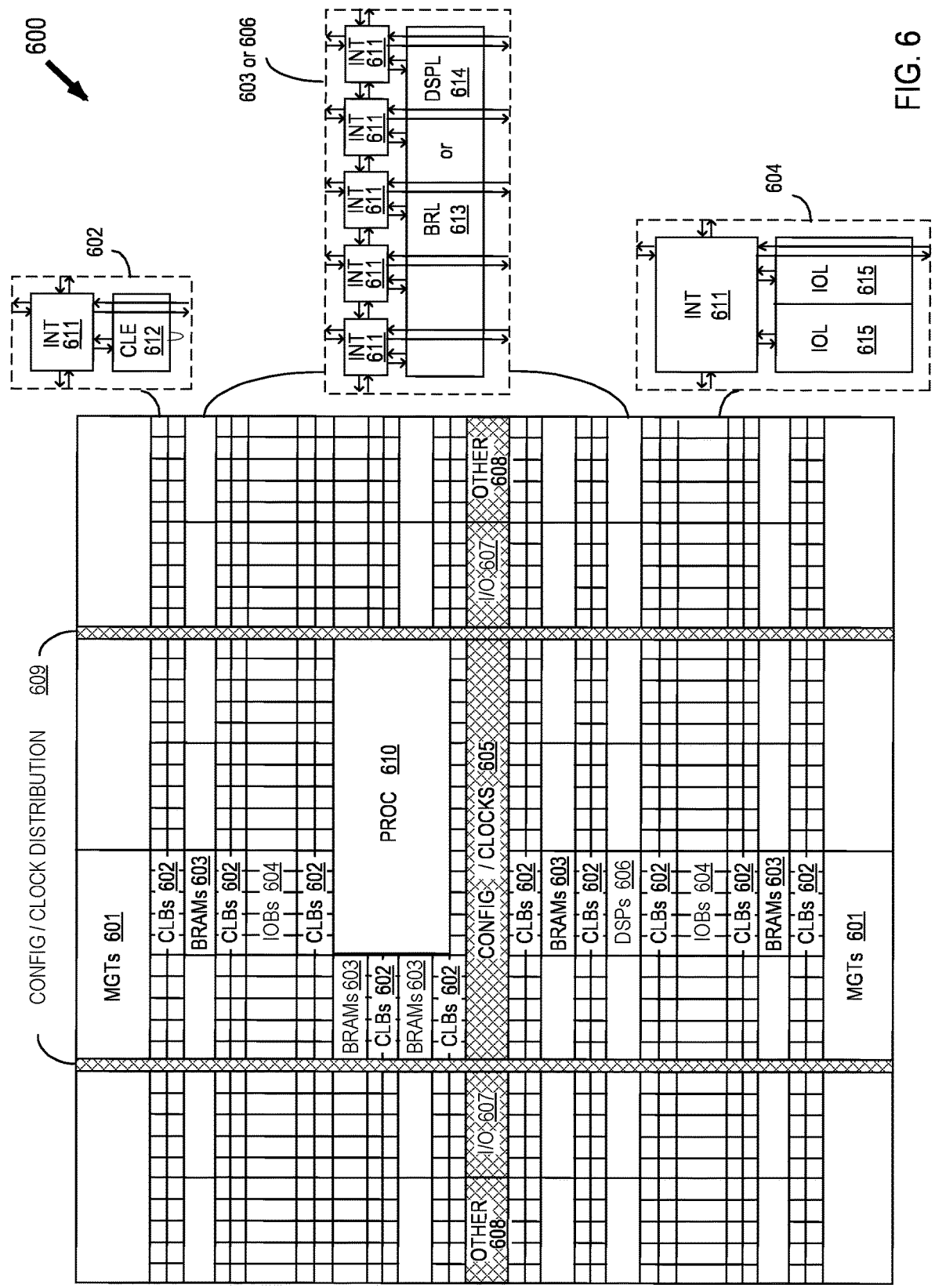
FIG. 6 shows a programmable integrated circuit on which the disclosed circuits and processes may be implemented.

FIG. 6 shows a programmable integrated circuit (IC) 600 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown). The disclosed circuits and processes can also be implemented as ASICs or on an adaptive compute acceleration platform (ACAP). An ACAP has FPGA fabric with distributed memory and hardware-programmable DSP blocks, a multi-core SoC, and one or more software programmable, yet hardware adaptable, compute engines, all connected through a network on chip (NoC).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

A columnar area near the center of the die (shown shaded in FIG. 6) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for compensating for the effects of leakage current from memory cells. Other aspects and features will be apparent to those skilled in the art from consideration of the specification. The circuits and methods may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit comprising:
   a first sensing circuit coupled to a first data line and configured to sense a level of current leakage or a memory cell state on the first data line;
   a first keeper circuit coupled to the first data line and configured to drive the first data line by a voltage supply through a biased transistor;
   a first leakage latch coupled to receive and latch a state of a signal output from the first sensing circuit;
   a second sensing circuit coupled to a second data line and configured to sense a level of current leakage or a memory cell state on the second data line;
   a second keeper circuit coupled to the second data line and configured to drive the second data line by a voltage supply through a biased transistor;
   a second leakage latch coupled to receive and latch a state of a signal output from the second sensing circuit; and
   a first control circuit coupled to outputs of the first leakage latch and the second leakage latch and coupled to receive the outputs of the first sensing circuit and the second sensing circuit, wherein the first control circuit is configured to select either the signal output from the first sensing circuit or the signal output from the second sensing circuit in response to states of signals output from the first leakage latch and the second leakage latch.

2. The circuit of claim 1, comprising:
   a first data latch coupled to the first sensing circuit, the first keeper circuit, and the first data line, wherein the first data latch is configured to latch the state of the signal output from the first sensing circuit; and
   a second data latch coupled to the second sensing circuit, and the second keeper circuit, and the second data line, the second data latch configured to latch the state of the signal output from the second sensing circuit.

3. The circuit of claim 1, wherein the first control circuit is configured to adjust strengths of the first keeper circuit and the second keeper circuit in response to states of the first leakage latch and the second leakage latch.

4. The circuit of claim 1, comprising:
   a plurality of addressable memory cells having complementary outputs coupled to the first data line and to the second data line, respectively; and
   wherein the first control circuit is configured to close the first leakage latch and the second leakage latch during a read operation.

5. The circuit of claim 4, comprising:
   a second control circuit coupled to the first sensing circuit and to the second sensing circuit and configured to enable the first leakage latch and the second leakage latch to latch states of signals output from the first sensing circuit and the second sensing circuit, respectively, in response to a counted a number of write operations to the memory cells.

6. The circuit of claim 1, comprising:
a second control circuit coupled to the first sensing circuit and to the second sensing circuit and configured to enable the first leakage latch and the second leakage latch to latch the states of signals output from the first sensing circuit and the second sensing circuit, respectively, in response to a sensed temperature.

7. The circuit of claim 1, comprising:
a plurality of addressable memory cells having complementary outputs coupled to the first data line and to the second data line, respectively;
a second control circuit coupled to the first sensing circuit and to the second sensing circuit and configured to enable the first leakage latch and the second leakage latch to latch the states of signals output from the first sensing circuit and the second sensing circuit, respectively, before assertion of address signals to the memory cells.

8. The circuit of claim 1, wherein the first control circuit is configured to:
output a signal that is a complementary logic value of the state of the signal output from the first sensing circuit in response to a state of the signal output from the first leakage latch being logic value 1 and a state of the signal output from the second leakage latch being logic value 0; and
output a signal that is a logic value of the state of the signal output from the second sensing circuit in response to a state of the signal output from the first leakage latch being logic value 0, or the state of the signal output from the first leakage latch being logic value 1 and a state of the signal output from the second leakage latch being logic value 1.

9. The circuit of claim 8, wherein the first control circuit is configured to:
adjust strength of the first keeper circuit and strength of the second keeper to a first level, and prevent the first keeper circuit from operating in latch mode in response to the state of the signal output from the first leakage latch being logic value 1 and the state of the signal output from the second leakage latch being logic value 1;
adjust strength of the first keeper circuit to a second level, adjust strength of the second keeper to the first level, and prevent the first keeper circuit from operating in latch mode in response to the state of the signal output from the first leakage latch being logic value 0 and the state of the signal output from the second leakage latch being logic value 1;
adjust strength of the first keeper circuit to the first level, adjust strength of the second keeper to the second level, and prevent the second keeper circuit from operating in latch mode in response to the state of the signal output from the first leakage latch being logic value 1 and the state of the signal output from the second leakage latch being logic value 0;
adjust strength of the first keeper circuit to the second level, adjust strength of the second keeper to the second level, and prevent the first keeper circuit from operating in latch mode in response to the state of the signal output from the first leakage latch being logic value 0 and the state of the signal output from the second leakage latch being logic value 0; and
wherein strength of the first level is less than strength of the second level.

10. The circuit of claim 1, comprising:
a first data latch coupled to the first sensing circuit, the first keeper circuit, and the first data line, wherein the first data latch is configured to latch the state of the signal output from the first sensing circuit;
a second data latch coupled to the second sensing circuit, the second keeper circuit, and the second data line, the second data latch configured to latch the state of the signal output from the second sensing circuit; and
wherein the first control circuit is configured to adjust strengths of the first keeper circuit and the second keeper circuit in response to the states of the first leakage latch and the second leakage latch.

11. A method comprising:
sensing levels of current leakage on a first data line and a second data line by first and second sensing circuits, respectively, wherein the first data line and the second data line are coupled to complementary internal nets of a memory cell, respectively;
storing a logic value indicative of the level of current leakage sensed on the first data line in a first leakage latch; and
storing a logic value indicative of the level of current leakage sensed on the second data line in a second leakage latch;
adjusting strengths of first and second keeper circuits coupled to the first data line and second data line in response to sensed levels of current leakage; and
selecting a signal on the first data line from the first sensing circuit or a signal on the second data line from the second sensing circuit for output in response to the sensed levels of current leakage indicated by states of the first leakage latch and the second leakage latch.

12. The method of claim 11, comprising:
latching a state of a signal output from the first sensing circuit in a first data latch; and
latching a state of a signal output from the second sensing circuit in a second data latch.

13. The method of claim 11, comprising adjusting strengths of the first keeper circuit and the second keeper circuit in response to states of the first leakage latch and the second leakage latch.

14. The method of claim 11, comprising enabling the first leakage latch and the second leakage latch to latch states of signals output from the first sensing circuit and the second sensing circuit, respectively, in response to a counted a number of write operations to a plurality of addressable memory cells having complementary internal nets coupled to the first data line and to the second data line.

15. The method of claim 11, enabling the first leakage latch and the second leakage latch to latch states of signals output from the first sensing circuit and the second sensing circuit, respectively, in response to a sensed temperature.

16. The method of claim 11, comprising:
outputting a signal that is a complementary logic value of a state of the signal output from the first sensing circuit in response to a state of a signal output from the first leakage latch being logic value 1 and a state of a signal output from the second leakage latch being logic value 0; and
outputting a signal that is a logic value of the state of the signal output from the second sensing circuit in response to a state of the signal output from the first leakage latch being logic value 0, or the state of the signal output from the first leakage latch being logic value 1 and a state of the signal output from the second leakage latch being logic value 1.

17. The method of claim 16, comprising:
adjusting strength of the first keeper circuit and strength of the second keeper to a first level, and preventing the first keeper circuit from operating in latch mode in response to the state of the signal output from the first leakage latch being logic value 1 and the state of the signal output from the second leakage latch being logic value 1;
adjusting strength of the first keeper circuit to a second level, adjusting strength of the second keeper to the first level, and preventing the first keeper circuit from operating in latch mode in response to the state of the signal output from the first leakage latch being logic value 0 and the state of the signal output from the second leakage latch being logic value 1;
adjusting strength of the first keeper circuit to the first level, adjusting strength of the second keeper to the second level, and preventing the second keeper circuit from operating in latch mode in response to the state of the signal output from the first leakage latch being logic value 1 and the state of the signal output from the second leakage latch being logic value 0;
adjusting strength of the first keeper circuit to the second level, adjusting strength of the second keeper to the second level, and preventing the first keeper circuit from operating in latch mode in response to the state of the signal output from the first leakage latch being logic value 0 and the state of the signal output from the second leakage latch being logic value 0; and
wherein strength of the first level is less than strength of the second level.

18. The method of claim 11, comprising closing the first leakage latch and the second leakage latch during a read operation.

19. The method of claim 11, comprising:
wherein the sensing includes:
activating pre-charge drivers that pre-charge the first and second data lines;
opening the first leakage latch and the second leakage latch that are coupled to outputs of the first and second sensing circuits, respectively;
tri-stating a first data latch and a second data latch while the pre-charge drivers are activated;
after pre-charging the first and data lines, tri-stating the pre-charge drivers and opening the first and second data latches; and
waiting for a first period of time and then closing the first and second leakage latches, whereby logic values that indicate levels of current leakage sensed on the first and second data lines are latched;
during a second period of time for sensing the memory cell, wherein the first period of time is greater than the second period of time:
tri-stating the first and second data latches;
activating the pre-charge drivers;
keeping the first and second leakage latches closed; and
after pre-charging the first and data lines, tri-stating the pre-charge drivers and opening the first and second data latches, whereby logic values that indicate logic values sensed on the first and second data lines are latched; and
wherein the selecting includes selecting output from the first data latch or the second data latch for output in response to logic values in the first and second leakage latches.

* * * * *